United States Patent
Dokumaci et al.

(10) Patent No.: US 6,642,147 B2
(45) Date of Patent: Nov. 4, 2003

(54) METHOD OF MAKING THERMALLY STABLE PLANARIZING FILMS

(75) Inventors: Omer H. Dokumaci, Wappinger Falls, NY (US); Bruce B. Doris, Brewster, NY (US); Michael P. Belyansky, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 09/938,097

(22) Filed: Aug. 23, 2001

(65) Prior Publication Data

US 2003/0038109 A1 Feb. 27, 2003

(51) Int. Cl.$^7$ ............................................. H01L 21/302
(52) U.S. Cl. ........................ 438/691; 438/692; 438/693
(58) Field of Search .................... 438/690, 691, 438/692, 693, 745, 750, 706, 710; 216/41

(56) References Cited

U.S. PATENT DOCUMENTS

| | | | | |
|---|---|---|---|---|
| 4,464,701 A | * | 8/1984 | Roberts et al. ............. 361/313 |
| 4,502,202 A | | 3/1985 | Malhi ......................... 29/571 |
| 4,555,843 A | | 12/1985 | Malhi ......................... 29/571 |
| 4,564,584 A | | 1/1986 | Fredericks et al. |
| 4,728,617 A | | 3/1988 | Woo et al. ..................... 437/30 |
| 4,745,086 A | | 5/1988 | Parrillo et al. ............... 437/57 |
| 4,996,080 A | | 2/1991 | Daraktchiev ................. 427/57 |
| 5,166,770 A | * | 11/1992 | Tang et al. .................. 257/770 |
| 5,453,389 A | | 9/1995 | Strain et al. .................. 437/31 |
| 5,472,898 A | | 12/1995 | Hong et al. |
| 5,500,188 A | * | 3/1996 | Hafeman et al. ......... 422/82.02 |
| 5,536,669 A | | 7/1996 | Su et al. |
| 5,665,621 A | | 9/1997 | Hong |
| 5,674,657 A | | 10/1997 | Tan et al. .................... 430/191 |
| 5,731,239 A | | 3/1998 | Wong et al. ................. 438/296 |
| 5,828,102 A | | 10/1998 | Bergemont ................. 257/342 |
| 5,856,225 A | | 1/1999 | Lee et al. .................... 438/291 |
| 5,893,739 A | | 4/1999 | Kadosh et al. .............. 438/286 |
| 5,910,257 A | * | 6/1999 | Fukuda et al. ................ 216/93 |
| 5,910,453 A | * | 6/1999 | Gupta et al. ................. 438/717 |
| 5,923,231 A | * | 7/1999 | Ohkubo et al. .............. 333/193 |
| 6,008,096 A | | 12/1999 | Gardner et al. ............. 438/300 |
| 6,020,236 A | * | 2/2000 | Lee et al. .................... 438/253 |
| 6,060,345 A | | 5/2000 | Hause et al. |
| 6,060,358 A | | 5/2000 | Bracchitta et al. .......... 438/259 |
| 6,060,364 A | | 5/2000 | Maszara et al. ............. 438/305 |
| 6,110,818 A | | 8/2000 | Haskell ....................... 438/621 |
| 6,117,715 A | | 9/2000 | Ha |
| 6,133,102 A | | 10/2000 | Wu |
| 6,156,598 A | | 12/2000 | Zhou et al. |
| 6,190,839 B1 | | 2/2001 | Pavelchek et al. .......... 430/325 |
| 6,207,787 B1 | | 3/2001 | Fahey et al. ................. 528/125 |
| 6,239,008 B1 | | 5/2001 | Yu et al. |
| 6,242,316 B1 | * | 6/2001 | Joo ............................. 438/398 |
| 6,251,731 B1 | | 6/2001 | Wu |
| 6,251,795 B1 | * | 6/2001 | Shan et al. .................. 438/723 |
| 6,258,677 B1 | | 7/2001 | Ang et al. |
| 6,277,683 B1 | | 8/2001 | Pradeep et al. |
| 6,291,278 B1 | | 9/2001 | Xiang et al. |
| 6,346,747 B1 | * | 2/2002 | Grill et al. ................... 257/752 |
| 6,383,864 B2 | * | 5/2002 | Scheller et al. ............. 438/243 |

FOREIGN PATENT DOCUMENTS

| | | |
|---|---|---|
| EP | 484128 | 5/1992 |
| JP | 06053507 A | 2/1994 |
| JP | 06204213 | 7/1994 |
| JP | 06349765 | 12/1994 |
| JP | 09312397 A | 12/1997 |

* cited by examiner

*Primary Examiner*—Robert Kunemund
*Assistant Examiner*—Lan Vinh
(74) *Attorney, Agent, or Firm*—F. Chau & Associates, LLP

(57) ABSTRACT

Disclosed is a method of protecting semiconductor areas while exposing a structures for processing on a semiconductor surface, the method comprising depositing a planarizing high density plasma film of a silicon compound, selected from the group silicon oxide and silicon nitride, depositing a planarized polymer film to a thickness effective in protecting said high density plasma film while leaving high density plasma excess exposed, and etching away said high density plasma excess.

20 Claims, 9 Drawing Sheets

METHOD OF MAKING THERMALLY STABLE PLANARIZING FILMS

BACKGROUND OF THE INVENTION

1. Field of the Invention

This invention relates to a method of depositing planarized silicon nitride and silicon oxide films on semiconductors without the use of chemical mechanical polishing (CMP).

2. Discussion of the Related Art

Planarization of semiconductor wafer surfaces up to a feature height has many useful applications in semiconductor manufacturing, such as the ability, with regard to MOSFETS, to implant gate/sources independently of gates and even to replace gates altogether. Typically, when a semiconductor device gate or other protruding feature is to be removed, etched, or doped or subjected to some other processing, surrounding source and drain regions or other sensitive areas are protected by laying down a layer of tetraethoxysilane, tetraethylorthosilicate, tetraethelorthosilicate, or tetrethoxysilicide, any of which is referred to in the semiconductor art as TEOS. Other protective oxides used in the art include spin-on-oxides and borophosphosilicate (BPSG) glass. After deposition of these oxides, it is necessary to planarize the TEOS layer down to the gate so as to expose the gate for subsequent processing. The planarizing is usually accomplished by chemical mechanical polishing (CMP). Aside from the disadvantage of having to perform a CMP operation, CMPs have other disadvantages. For one, CMP operations cause dishing in the oxide when the gates are spaced relatively far apart. Dishing can lead to shorts developing between the gates during gate replacement operations because new gate material is deposited in the dished areas. Dishing can also cause penetration of an implant through the TEOS into the underlying layer.

SUMMARY OF THE INVENTION

Disclosed is a method of obtaining thermally stable planarizing films while exposing structures for further processing, the method comprising depositing a planarizing silicon compound film, selected from the group silicon oxide and silicon nitride, depositing a planarized organic polymer film to a thickness effective in protecting the silicon compound film to a thickness effective in leaving silicon compound excess exposed, and etching away the silicon compound excess so as to expose the underlying structures.

In a further aspect of the invention, the organic polymer film is then removed.

In another aspect of the invention, the planarizing silicon compound film is deposited by high density plasma chemical vapor deposition.

In another aspect of the invention, the organic polymer film comprises a photoresist.

In another aspect of the invention, the organic polymer film comprises an anti-reflective coating.

In another aspect of the invention, the organic polymer film comprises a novolak resin.

In another aspect of the invention, the organic polymer film comprises an organic polymer selected from a novolak resin, a copolymer of benzophenone and bisphenol-A, a film formed from an organic solution of multifunctional acrylates and methacrylate monomers, polyurea, and polysulfone.

In another aspect of the invention, said depositing of a planarized organic polymer film further comprises depositing a layer of organic polymer to a thickness sufficient to cover said excess and then etching back said organic polymer so as to expose said excess.

In another aspect of the invention, the organic polymer film is formed by the method of depositing a conformal organic polymer on the substrate and planarizing the resulting conformal organic polymer film by chemical mechanical polishing.

In another aspect of the invention, the underlying structures comprise silicon or polysilicon.

In another aspect of the invention, the underlying structures comprise metal, the planarizing silicon compound film is silicon nitride, and the etching away of the silicon compound excess comprises a phosphoric acid etch.

In another aspect of the invention, the underlying structures comprise metal, the planarizing silicon compound film is silicon nitride, and the etching away of the silicon compound excess comprises a sodium hydroxide etch.

In another aspect of the invention, the underlying structures comprise metal, the planarizing silicon compound film is silicon oxide, and the etching away of the silicon compound excess comprises a dry plasma methane/methyltrifluoride etch.

DESCRIPTION OF PREFERRED EMBODIMENTS

Figure 1:
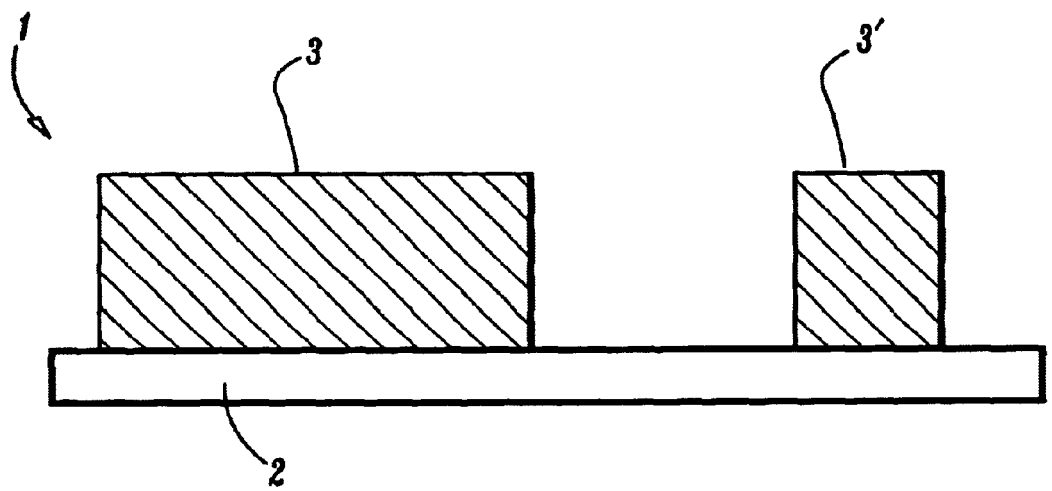
FIG. 1 shows typical silicon or polysilicon gate structures.

Referring to FIG. 1, there is shown a portion of a semiconductor wafer 1 having typical gate structures thereon. The gate structures comprise a long silicon or polysilicon gate structure 3, a short silicon or polysilicon gate structure 3', and a substrate 2, which may also comprise a buried oxide layer (BOX) if this is to be the currently popular silicon over insulator (SOI) technology, otherwise this comprises any suitable substrate, such as silicon, silicon germanium, strained silicon, and the like. Under the gate material is a gate dielectric that may be made of silicon oxide, oxynitride, or suitable high-k dielectric. There may also be optional silicon nitride spacers (not shown) on either side of the gates, depending on what stage of manufacture the teachings of the invention are used. The teachings of the invention may actually be implemented at any time after patterning of the gate. It may be desirable to deposit a liner after gate patterning, chosen so as to protect the underlying substrate if the planarized layer of the invention is to be removed in subsequent processing.

Figure 2:
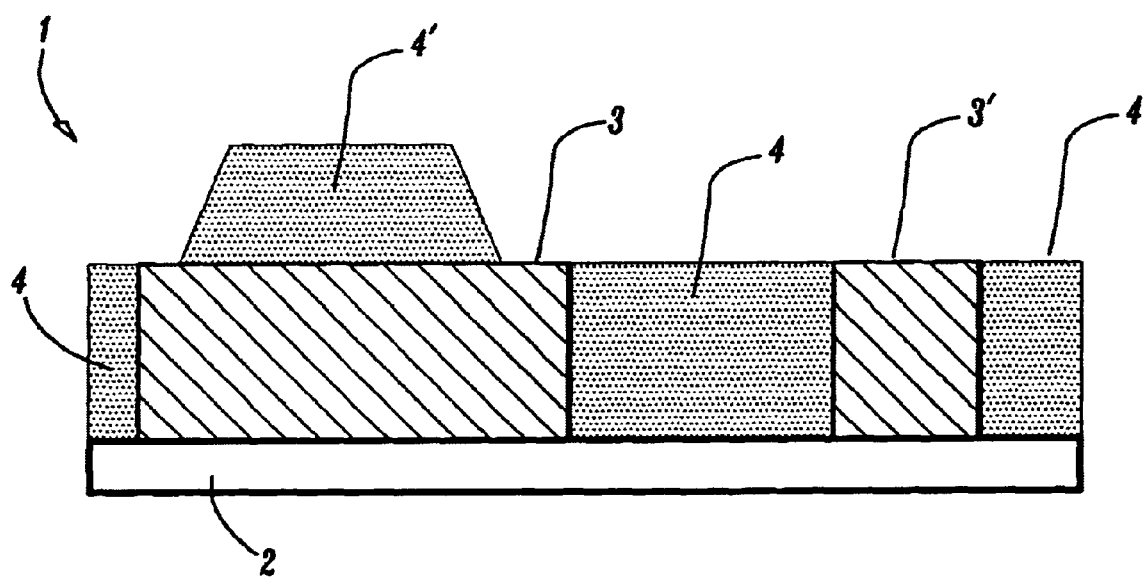
FIG. 2 shows the result of a silicon oxide or nitride deposition.

Referring to FIG. 2, a planarizing HDP (high density plasma) film 4 of silicon oxide or silicon nitride is deposited on the substrate 1. For most applications, silicon oxide will generally be the preferred material. When long structures are present, such as the long polysilicon gate 3 shown, there is substantial HDP excess 4' deposited on top of these structures. This is usually because maximum removal of the deposited material from the top of all structures occurs at the corners of the structures as a result of sputter etching. This so-called "corner faceting" will usually remove all of the material from the tops of smaller structures, but leave substantial thicknesses of material on longer and wider structures.

HDP-CVD silicon nitride films may generally be formed by reacting silane gas ($SiH_4$) with either ammonia ($NH_3$) or nitrogen ($N_2$) gas in the presence of electromagnetic radiation and an inert gas, such as Argon (Ar) or Helium (He) for example, while HDP-CVD silicon oxide films may generally be formed by reacting silane gas ($SiH_4$) with oxygen ($O_2$) gas under similar conditions.

Generally, the reaction pressure will be rather low, generally below ten mTorr, and will usually be conducted in a magnetron sputtering environment. Under these the film being deposited begins to cover all the surfaces on the wafer conformally, including the sidewalls and bottoms of contact holes and trenches. Under normal CVD processes, this would cause an overhang at the rims of the trenches and holes that would eventually close off at the top, thereby leaving a cavity within. However, in HDP deposition the excitation of the inert gases and reactants into a high-energy plasma causes the deposited material to be continuously sputtered away even as it is being deposited. The result is that the deposited material behaves like a fluid and settles into the trenches and holes from the bottom up in a planarized, rather than conformal, manner and thereby avoiding the formation of any cavities.

HDP-CVD reactors will generally utilize a glow discharge to produce ions powerful enough to cause sputtering in the material being deposited. Glow discharges are a self-sustaining plasma produced by either or both of a dc-diode type system or an rf-diode system. An inert gas, such as Argon is introduced between a pair of electrodes with a strong enough electric field to ionize the reactant and inert gases to a plasma. Rf-diode systems are preferred because they can operate at significantly lower pressures and deliver higher deposition rates than dc-diode systems. A preferred rf-diode system will be equipped with a magnetron source so as to help confine electrons near the wafer surface. Commercially popular systems include those sold under the tradename "Centura" by Applied Materials.

Figure 3A:
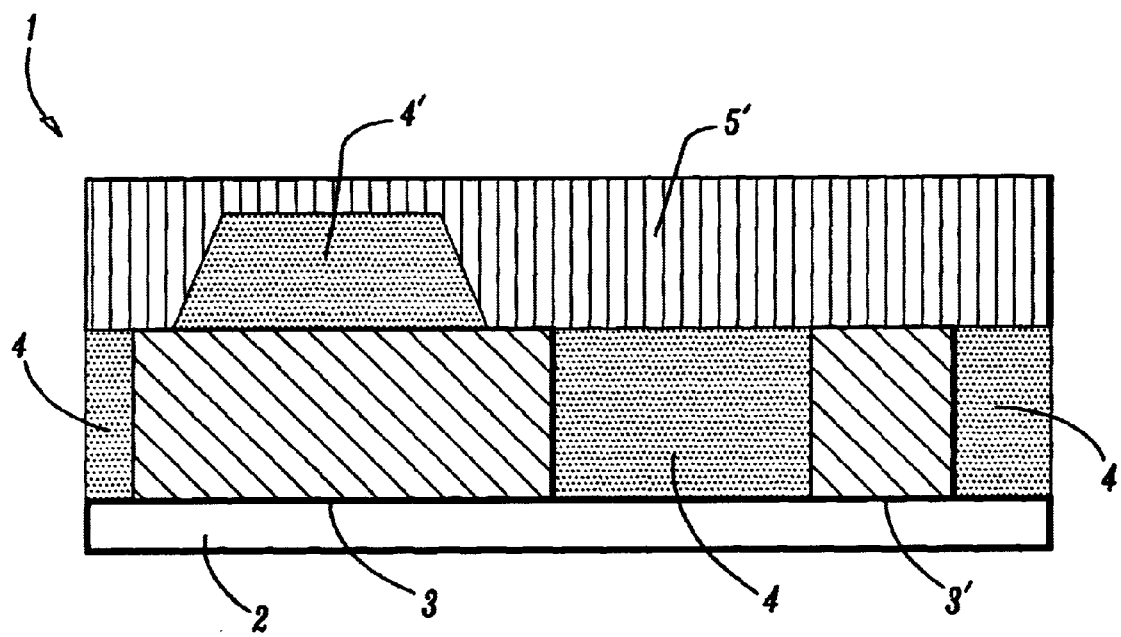
FIGS. 3a and 3b show a planarized polymer deposition.
Figure 3B:
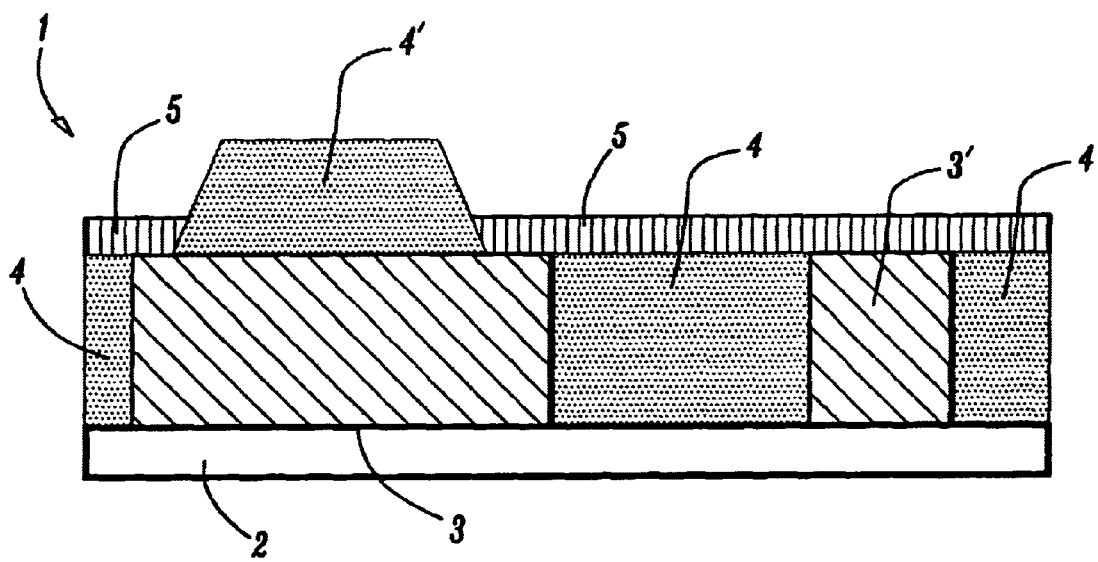

Referring to FIGS. 3a and 3b there is shown a preferred alternative wherein the substrate is first covered with a thick planarized organic polymer layer 5', and then a plasma $O_2$ or $N_2$ etchback is used to etch the layer 5' back down at or below the level of the excess 4', thereby generating the planarized organic polymer film 5 structure shown in FIG. 3b. To do this it is necessary to know the thickness of the organic layer 5 and the etching rate of the etchback process. Deposition of the polymer film 5 may be deposited using "spin-on" devices well known in the art.

Technically, we will describe the excess 4' as being "exposed", but throughout this specification this is to be construed to encompass the concept of being "chemically exposed", which is to say that enough polymer film 5 is removed from the excess 4' so as to permit the excess 4' to be attacked with an etch. This is because there often will be a thin residue of polymer 5 on the excess 4', but not enough that the etchants used to etch away the excess cannot pass through or around such residues.

The protective polymer film 5 will preferably be any suitable organic polymer that is planarizing (i.e., it fills up the depressions rather than conforming to the topography of the depressions) and for which there exists a selective etch with respect to the HDP film material (i.e., an etch that will etch the polymer, but not the HDP film). Commonly available and economical protective polymers are those sold for anti-reflective coatings and photo-resist layers in the lithographic arts, often referred to as "organic spin-on" polymers, which comprise polymer resins dissolved in solvent. Such resins will typically have molecular weights in the thousands or ten thousands as measured by gel permeation chromatography, but may even go into the millions. Novolak binder resins are commonly available and useful for use in the invention, such as are disclosed in Shiro et al., U.S. Pat. No. 5,674,657, POSITIVE-WORKING PHOTORESIST COMPOSITIONS COMPRISING AN ALKALI-SOLUBLE NOVOLAK RESIN MADE WITH FOUR PHENOLIC MONOMERS, the teachings of which are incorporated by reference herein in their entirety. A commonly used photoresist is sold under the designation "HPR-204" by Olin Hunt Specialty Products of New Jersey and comprises mixed meta- and para-cresol novolak binder resins and a napthaquinone-1,2-diazide-5-sulfonic acid triester of a trihydroxy benzophenone sensitizer dissolved in 85% by weight of ethyl cellusolve acetate, 8.6% by weight butyl acetate, and 5.2% by weight xylene, and 1.2% by weight ethyl benzene. Suitable antireflective coatings are co-polymers of benzophenone and bisphenol-A dissolved in an organic solvent, such as is described in Thomas et al., U.S. Pat. No. 6,207,787, ANTIREFLECTIVE COATING FOR MICROLITHOGRAPHY, the teachings of which are incorporated by reference herein in their entirety. Other suitable antireflective coatings include, but are certainly not limited to, organic solutions of multifunctional acrylates and methacrylate monomers, and polyurea and polysulfone polymers.

Photoresists and antireflective coatings may also be thinned or diluted by mixing in additional solvent, such as is described in Daraktchiev, I. S., U.S. Pat. No. 4,996,080, PROCESS FOR COATING A PHOTORESIST COMPOSITION ONTO A SUBSTRATE, the teachings of which are incorporated by reference herein in their entirety. Commercially available planarizing antireflective coatings suitable for use with the invention include those sold under the product designations "DUV 30" and "DUV 32", by Brewer Science, Inc. of Rolla, Mo.

Alternatively, one may deposit a conformal organic film and also planarize by CMP. Conformal organic films are generally comprised of relatively high molecular weight resins, as high as 40,000 Daltons and above, dissolved in solvent, such as are described in Pavelick et al., U.S. Pat. No. 6,190,839, HIGH CONFORMALITY ANTIREFLECTIVE COATING COMPOSITIONS, the disclosures of which are incorporated by reference herein in their entirety. Commercially available conformal antireflective coatings suitable for use with the invention include those sold under the product designations "ARC 25", "DUV 44", and "DUV 42", also by Brewer Science, Inc. of Rolla, Mo., and those sold under the "AR" series trademark by Shipley Company, LLC of Marlborough, Mass., particularly those designated "AR5" and higher, such as "AR7" and "AR14".

Also useful are rubberized organic resists, such as that once sold under the tradename KMER by Kodak Corporation, which was known to be highly resistant to silicon nitride wet phosphoric acid and sodium hydroxide etching and was quite popular as a metal etching mask in the 1970's, though these types of resists are not widely available today.

Of course, any polymer dissolved in a solvent that is sufficiently planarizing, adhering, and possessing the requisite selectivity will be suited to this invention. Photoresists and antireflective coatings are specifically cited for use with this invention because these materials are almost always readily at hand in any semiconductor fabrication facility.

Figure 4:
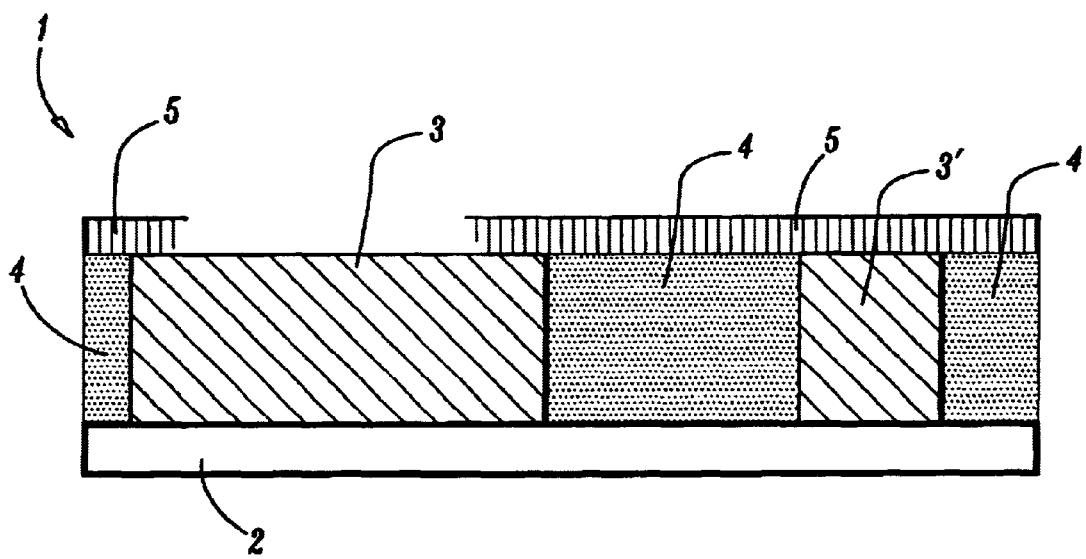
FIG. 4 shows the result of a silicon oxide or nitride etch.

Referring to FIG. 4, the HDP excess 4' is etched away to reveal the long structure 3' beneath. Such an etch will preferably be selective with respect to the polymer film 5 and the long structure 3 material.

Any etching method that does not harm the adjacent active areas is sufficient, such as an HF etch or a dry plasma process that is selective with respect to polysilicon and/or silicon and the organic polymer. Suitable gases for use in a dry etching plasma process for etching silicon oxides at a more rapid rate than polysilicon include $CF_4$—$O_2$ and $CF_4$—$H_2$ mixtures, wherein the percentage of $CF_4$ in these mixtures is generally no greater than 80%, more preferably no greater than 60%, and most preferably about 50%±10%. Substantially pure fluorocarbon plasmas, such as ethylhexafluorine ($C_2F_6$) may also be utilized.

An RIE etch of silicon nitride will generally utilize a $CF_4$—$O_2$ or $CHF_3$—$O_2$ gas mix, or $CH_2F_2$ or $CH_3F$ gasses, in the presence of an rf-frequency to establish a glow discharge. Typical reaction pressures are from about 7 to about 6000 mTorr. This etch is highly selective with respect to silicon oxide, but will easily etch polysilicon. Therefore, if one wishes to protect the polysilicon structures, they should be first protected with a silicon oxide film.

Other preferred etches for silicon nitride include phosphoric acid ($H_3PO_4$) and sodium hydroxide (NaOH) isotropic wet etches, which are selective with respect to organic polymers, polysilicon, silicon, and metals. These etches are effected by immersing the wafer in an aqueous solution of NaOH or $H_3PO_4$ at temperatures of generally 80° C. or more, preferably 100° C. or more, for ° C. sodium hydroxide etches and generally 150° C. or more, preferably 180° C. or more, for phosphoric acid etches. When performing a phosphoric acid etch, it is desirable to maintain the concentration of etchant in solution with reflux. A number of chemical bath systems are commercially available just for this purpose, such as those sold under the NITRAN brand name by Lufran, Inc., of Streetsboro, Ohio.

Figure 5:
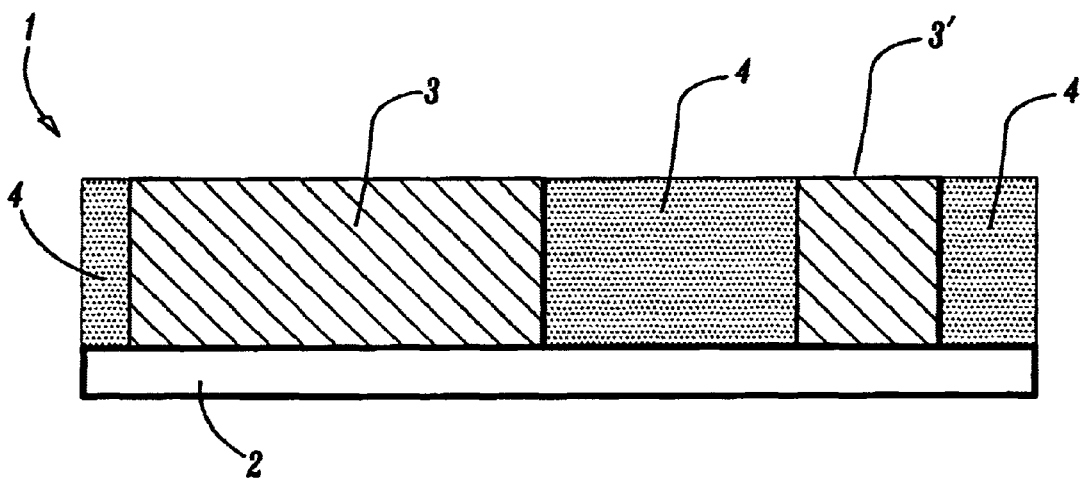
FIG. 5 shows the result of a polymer etch.
Figure 6:
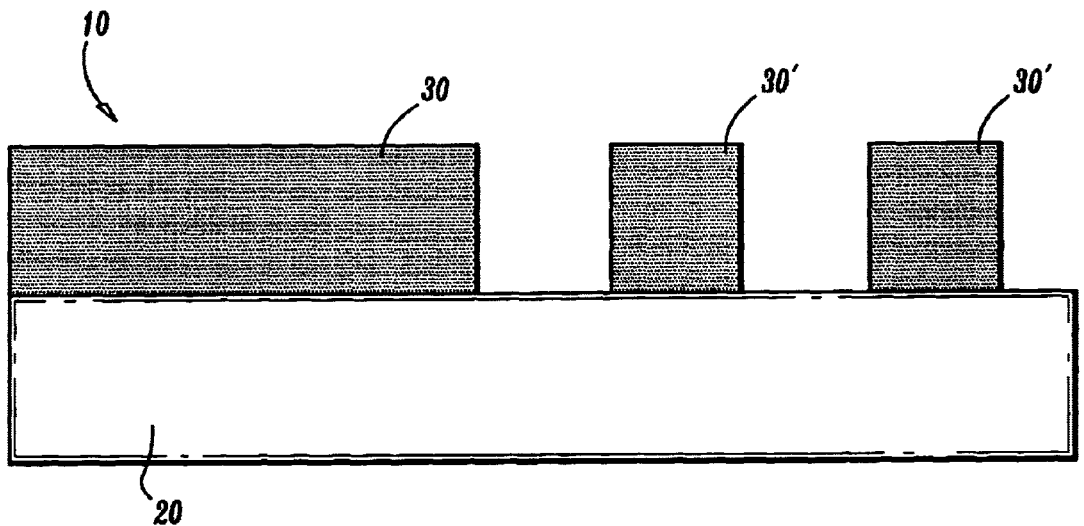
FIG. 6 shows typical metal structures.
Figure 7:
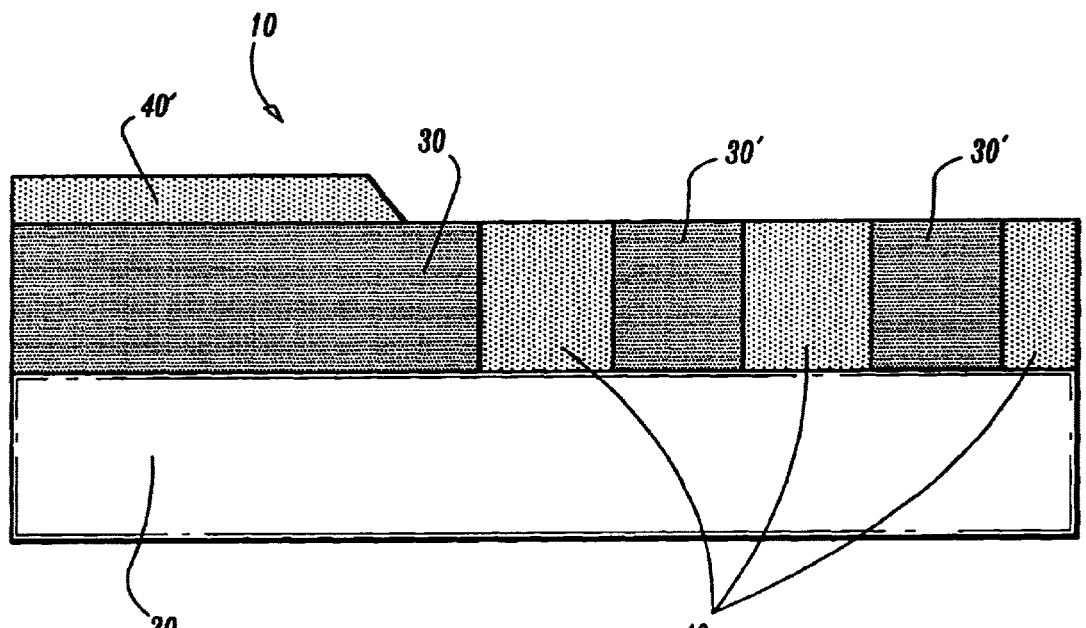
FIG. 7 shows the result of a silicon oxide or nitride deposition.

Referring to FIG. 5, the organic film 5 is removed, thereby leaving a planarized HDP film 4. At his point, the structures 3, 3' may be further processed at will.

Organic polymers may be etched by almost any plasma process containing high concentrations of oxygen gas. Oxygen plasmas are especially selective with respect to polysilicon, silicon oxide, and aluminum structures and will therefore leave such structures unharmed. The addition of fluorine-containing gases, such as $CF_4$ or $CHF_3$, $CH_2F_2$, or $CH_3F$, will significantly increase the etch rate, though also cause etching of any silicon nitride structures present. Referring to FIGS. 6 through 10, there is depicted the planarizing process of the invention for filling in the spaces between a plurality of metal structures 30, 30', such and gates or conductors and the like. As with polysilicon structures, there will be a buildup of excess 40' silicon oxide or nitride on the wider metal structures 30. Generally, it is desired to planarize metal patterned layers because a dielectric layer will usually be deposited on top of them and it is desired to keep the dielectric layer planar.

Figure 8A:
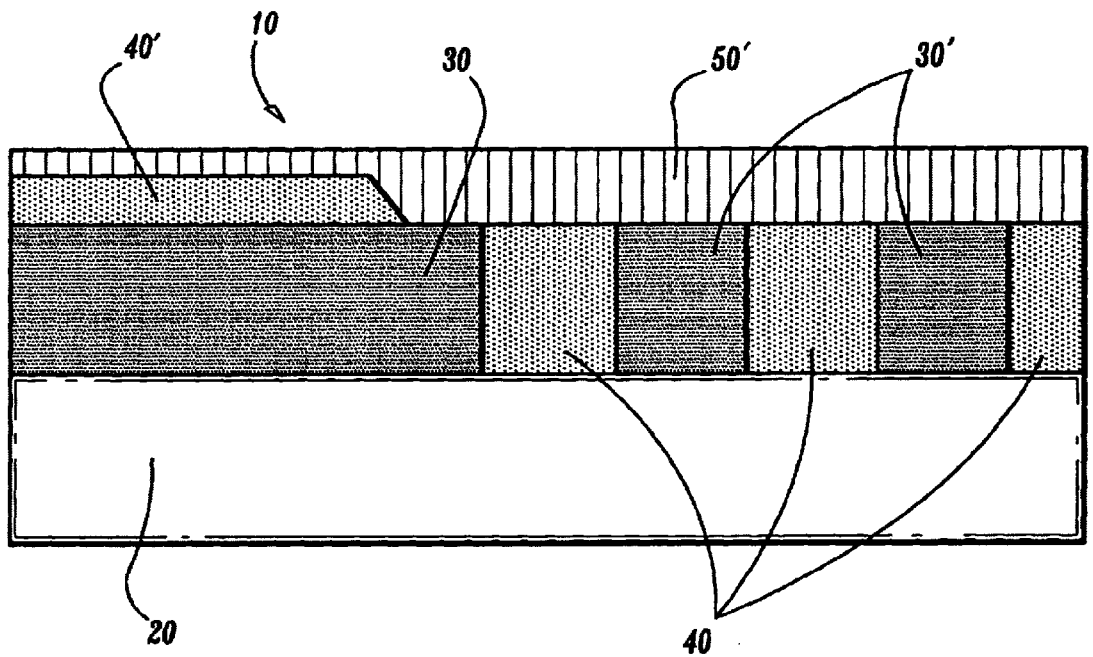
FIGS. 8a and 8b show a planarized polymer deposition.
Figure 8B:
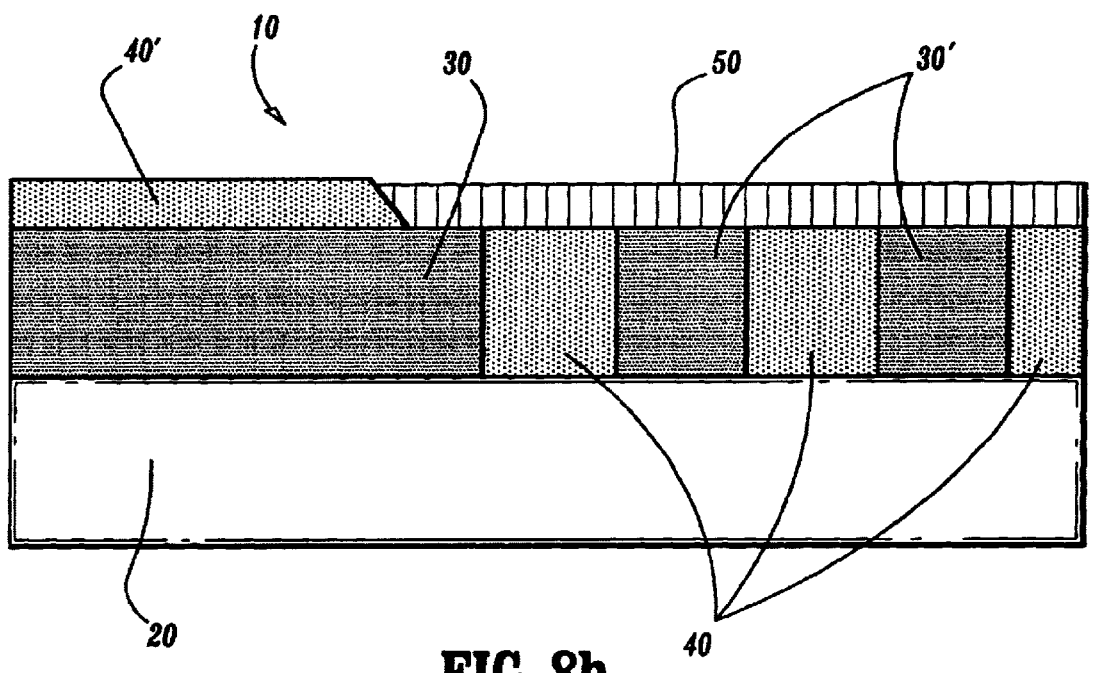
Figure 9:
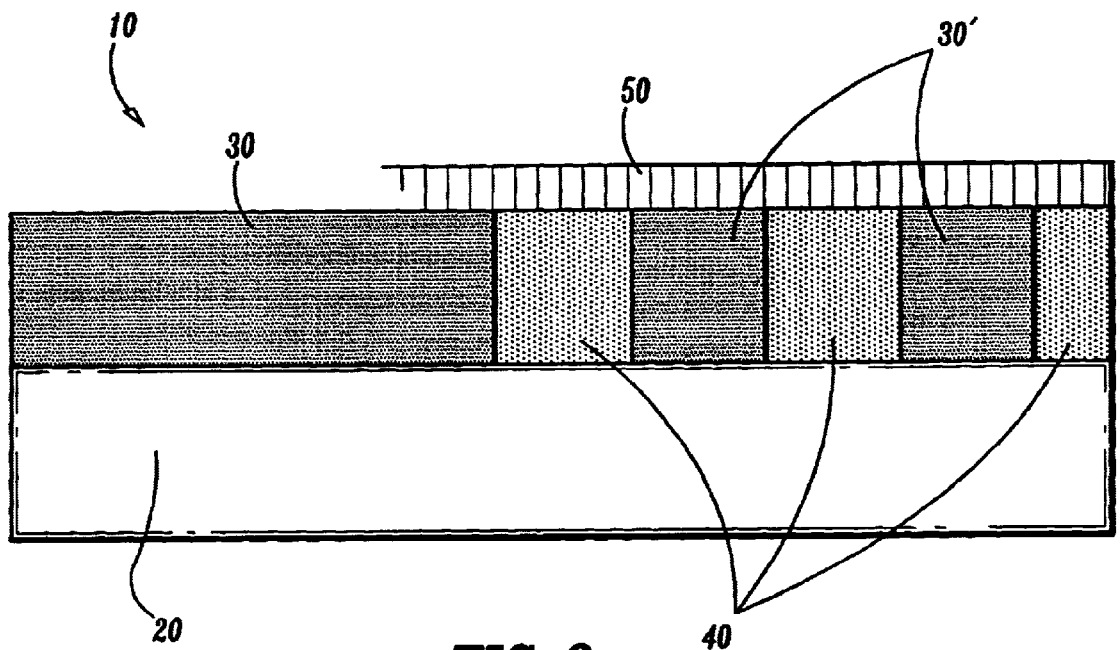
FIG. 9 shows the result of a silicon oxide or nitride etch.
Figure 10:
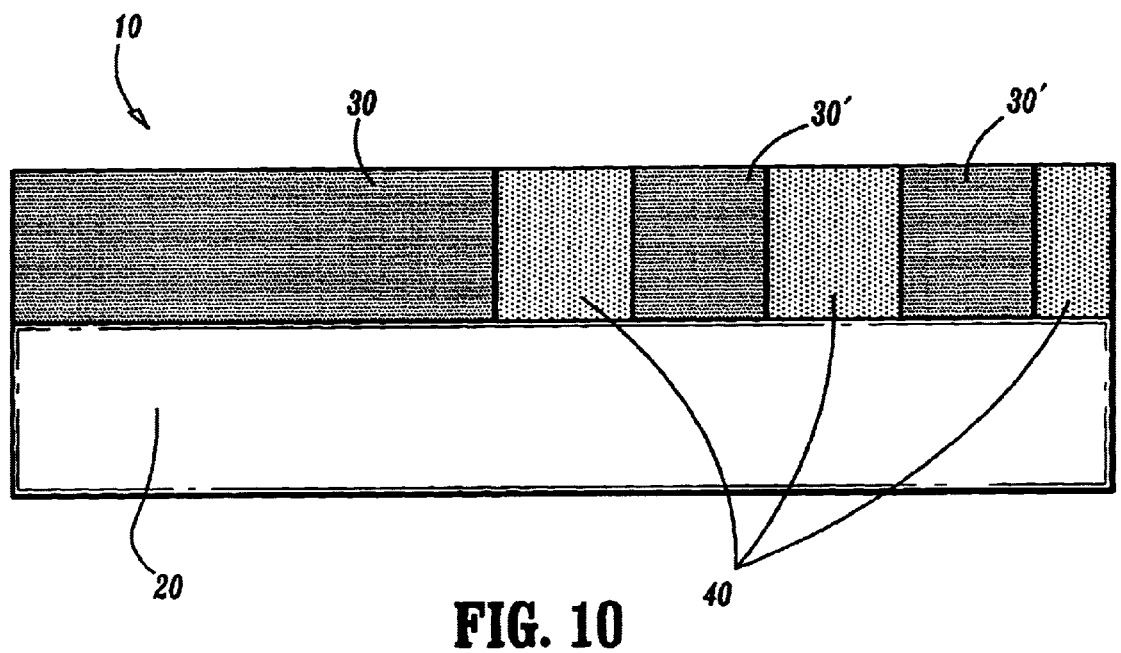
FIG. 10 shows the result of a polymer etch.
Figure 11:
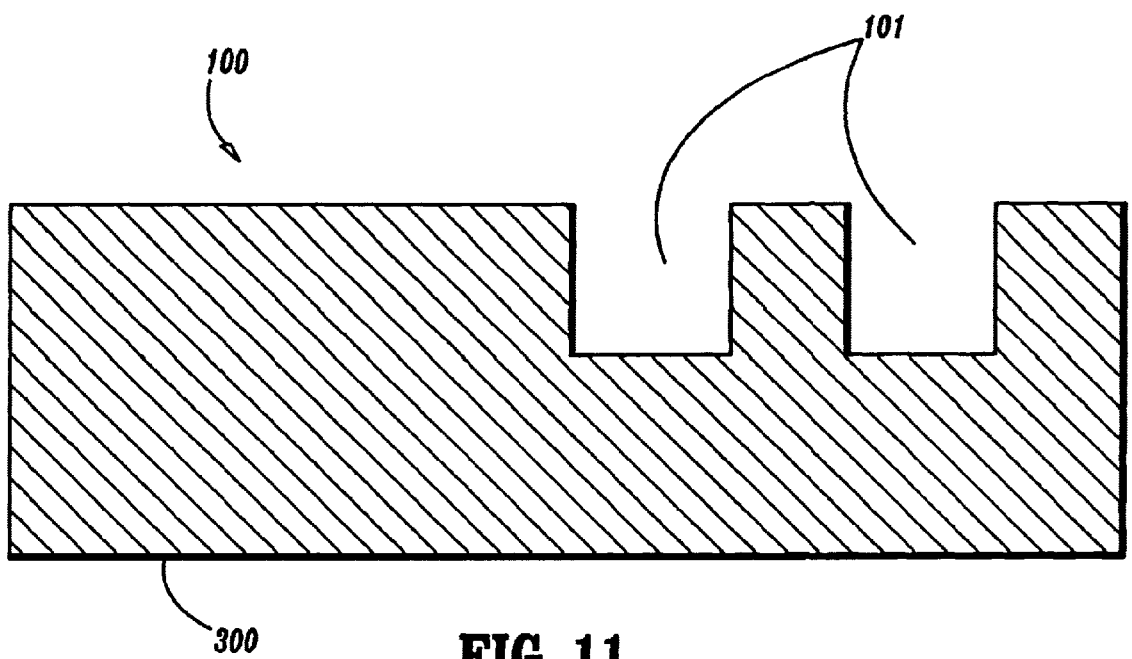
FIG. 11 shows typical trench isolation structures.
Figure 12:
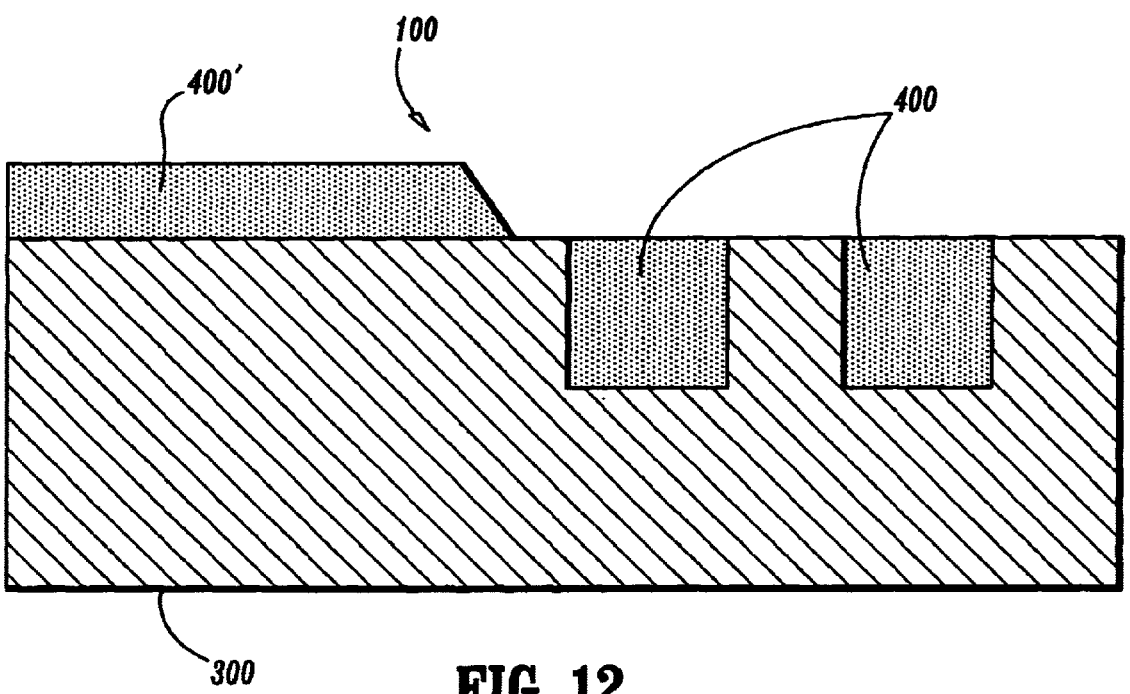
FIG. 12 shows the result of a silicon oxide or nitride deposition.
Figure 13A:
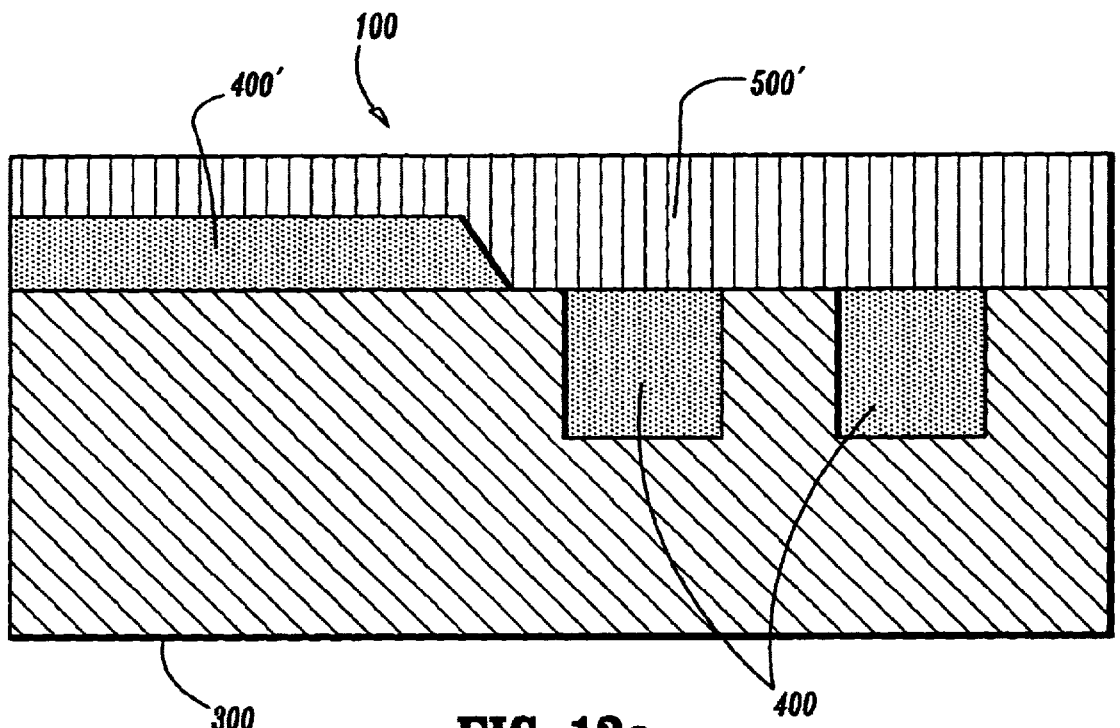
FIGS. 13a and 13b show a planarized polymer deposition.
Figure 13B:
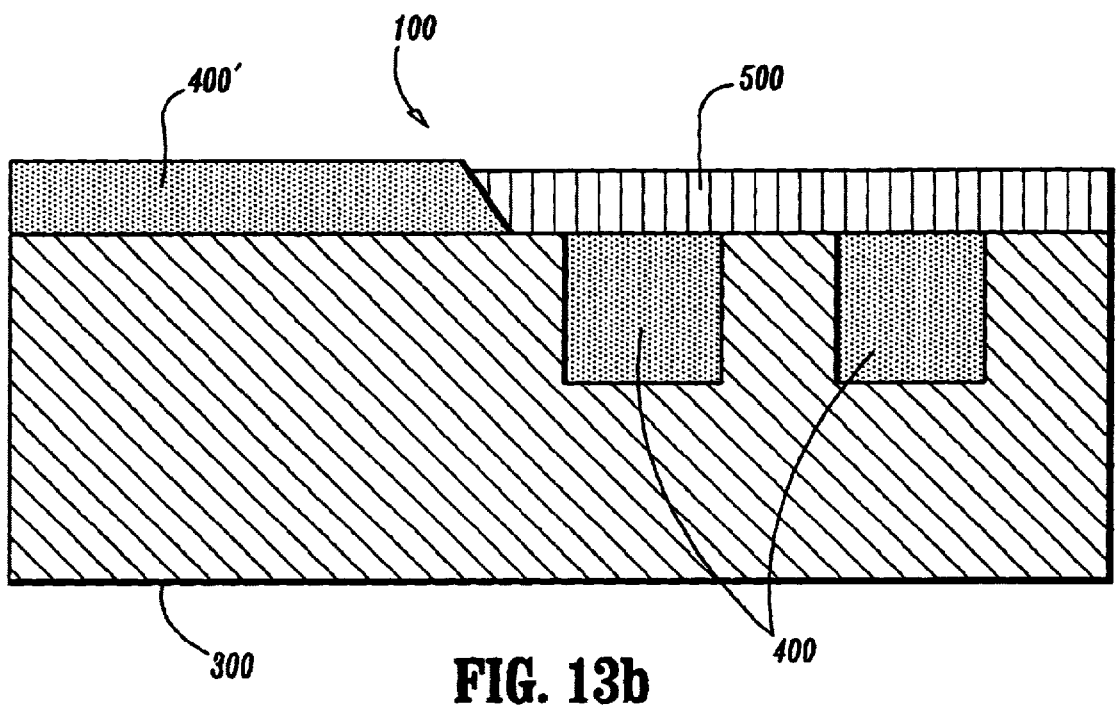
Figure 14:
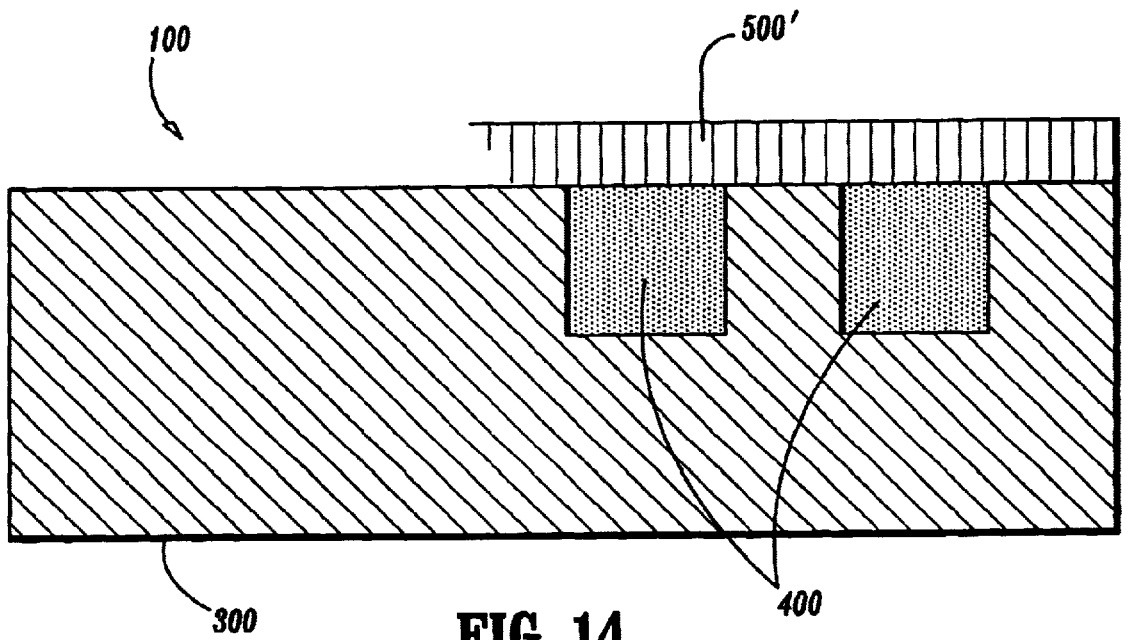
FIG. 14 shows the result of a silicon oxide or nitride etch.
Figure 15:
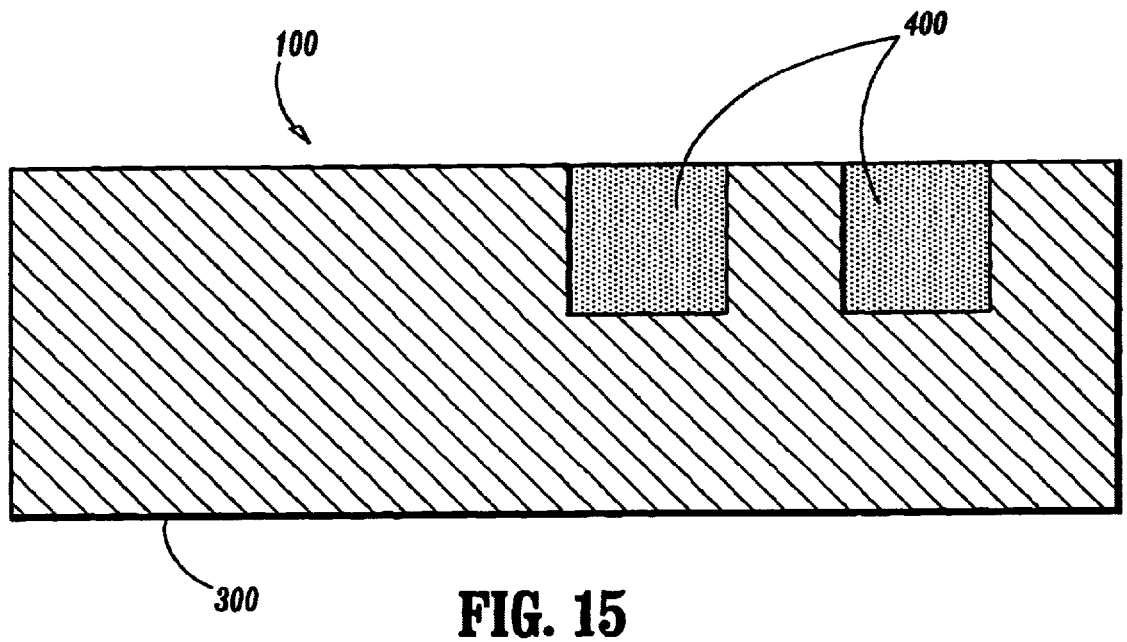
FIG. 15 shows the result of a polymer etch.

Referring to FIGS. 8 and 9, a planarizing organic polymer 50 layer is deposited at or below the level of the excess 40'. If the excess 40' is silicon nitride, then the excess can be removed with a hot phosphoric acid reflux bath or sodium hydroxide immersion, either of which is selective with respect to organic polymer and metal.

If the excess is silicon oxide, then a dry plasma etch utilizing a mixture of methane ($CH_4$) and methyl trifluoride ($CHF_3$) gases will give good selectivity with respect to the metal and the organic polymer.

Referring to FIGS. 11 through 15, there is depicted the planarizing process of the invention being used to fill in isolation trenches 101 carved into a silicon or polysilicon layer 300. Again, the wider silicon surfaces accumulate excess 400' silicon oxide or nitride and again a planarized organic polymer 500' layer is deposited at or below the height of the excess 400'. The chemistry involved is no different from that of FIGS. 1 through 5 and simply demonstrates that the invention can be put to any suitable use where a planarized surface is desired without resort to chemical mechanical polishing (CMP).

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention been described by way of illustration only, and such illustrations and embodiments as have been disclosed herein are not to be construed as limiting to the claims.

What is claimed is:

1. A method of obtaining thermally stable planarizing films while exposing structures for further processing, the method comprising:

depositing a planarizing silicon compound over a substrate comprising a pattern of structures to planarize said substrate by filling spaces between said structures, wherein said silicon compound film comprises silicon oxide or silicon nitride;

forming a planarized organic polymer film over the substrate to cover said structures and said silicon compound film filling said spaces between said structures, wherein excess silicon compound film on top of a structure is exposed; and etching away said exposed silicon compound film on top of said structure so as to expose said structure, wherein said organic polymer film protects the substrate during said etching.

2. The method of claim 1 further comprising removing said organic polymer film.

3. The method of claim 1 wherein said planarizing silicon compound film is deposited by high density plasma chemical vapor deposition.

4. The method of claim 1 wherein said organic polymer film comprises a photoresist.

5. The method of claim 4 wherein said organic polymer film comprises an anti-reflective coating.

6. The method of claim 1 wherein said organic polymer film comprises a novolak resin.

7. The method of claim 1 wherein said organic polymer film comprises an organic polymer, wherein said organic polymer comprises a novolak resin, a copolymer of benzophenone and bisphenol-A, a film formed from an organic solution of multifunctional acrylates and methacrylate monomers, polyurea, or polysulfone.

8. The method of claim 1 wherein said forming of said planarized organic polymer film comprises:

depositing a layer of organic polymer over said substrate; and etching back said organic polymer layer so as to expose said excess silicon compound film on top of said structure.

9. The method of claim 1 wherein said forming of said planarized organic polymer film comprises:

depositing a conformal organic polymer film on said substrate; and planarizing said conformal organic polymer film by chemical mechanical polishing to expose said excess silicon compound film on top of said structure.

10. The method of claim 1 wherein said structures comprise silicon or polysilicon.

11. The method of claim 1 wherein:

said structures comprise metal;

said planarizing silicon compound film is silicon nitride; and said etching said excess silicon compound film on top of said structure comprises a phosphoric acid etch.

12. The method of claim 1 wherein:

said structures comprise metal;

said planarizing silicon compound film is silicon nitride; and said etching said excess silicon compound film on top of said structure comprises a sodium hydroxide etch.

13. The method of claim 1 wherein:

said structures comprise metal;

said planarizing silicon compound film is silicon oxide; and said etching said excess silicon compound film on top of said structure comprises a dry plasma methane/methyltrifluoride etch.

14. A method of obtaining thermally stable planarizing films while exposing structures for further processing, the method comprising:

depositing a planarizing silicon compound film over a substrate to fill spaces formed between a plurality of gate structures on said substrate;

forming a planarized organic polymer film over said substrate to cover said gate structures and said silicon compound filling said spaces between said gate structures, wherein said excess silicon compound film on top of a gate structure is exposed;

etching away said exposed silicon compound on top of said gate structure so as to expose said gate structure, wherein said organic polymer film protects said substrate during said etching; and removing said planarized organic polymer film.

15. The method of claim 14, wherein forming said planarized organic polymer film comprises:

depositing a layer of organic polymer over said substrate; and etching back said organic polymer layer so as to expose said excess silicon compound film on top of said gate structure.

16. The method of claim 14 wherein said planarizing silicon compound film is deposited by high density plasma chemical vapor deposition.

17. The method of claim 14 wherein said organic polymer film comprises an anti-reflective coating.

18. The method of claim 14 wherein said organic polymer film comprises a photoresist.

19. The method of claim 14 wherein said organic polymer film comprises an organic polymer, wherein said organic polymer comprises a novolak resin, a copolymer of benzophenone and bisphenol-A, a film formed from an organic solution of multifunctional acrylates and methacrylate monomers, polyurea, or polysulfone.

20. The method of claim 14 wherein:

said planarizing silicon compound film is silicon nitride; and said etching said excess silicon compound comprises a phosphoric acid etch.

* * * * *